United States Patent [19]

Baerg et al.

[11] Patent Number: 4,980,019
[45] Date of Patent: Dec. 25, 1990

[54] ETCH-BACK PROCESS FOR FAILURE ANALYSIS OF INTEGRATED CIRCUITS

[75] Inventors: William Baerg, Palo Alto; Valluri R. M. Rao, Milpitas, both of Calif.

[73] Assignee: Intel Corporation, Santa Clara, Calif.

[21] Appl. No.: 387,081

[22] Filed: Jul. 28, 1989

Related U.S. Application Data

[62] Division of Ser. No. 243,787, Sep. 13, 1988.

[51] Int. Cl.$^5$ .......................................... H01L 21/308
[52] U.S. Cl. .................................... 156/643; 156/664; 156/662; 204/192.32; 437/923; 437/948
[58] Field of Search ............... 156/643, 664, 656, 901, 156/902, 662; 204/298.31, 298.33, 298.34, 192.32; 437/948, 923

[56] References Cited

U.S. PATENT DOCUMENTS 4,376,692  3/1983  Tsukada et al. ..................... 156/643

OTHER PUBLICATIONS

J. C. Wood, IBM Technical Disclosure Bulletin, vol. 24, No. 7A, Dec. 1981, Cleaning of Metal Surfaces by Ion-Etching.

*Primary Examiner*—David L. Lacey
*Assistant Examiner*—Todd J. Burns
*Attorney, Agent, or Firm*—Blakely, Sokoloff, Taylor & Zafman

[57] ABSTRACT

An apparatus and a method to inhibit sputtering of undesirable material on to a dielectric layer of an integrated circuit being etched. After exposing the integrated circuit within its package, the leads of the integrated circuit are electrically coupled together by a metallic foil. The metallic foil is wrapped about the package to also provide thermal coupling, however, the integrated circuit is left exposed. Then, the integrated circuit is placed onto an etch-resilient plate disposed atop a cathode electrode. An opening in the plate allows direct placement of the integrated circuit onto the cathode. An etch-resilient cover is placed above the plate opening and the integrated circuit, but the cover has an opening to expose the integrated circuit. During etching, the cover inhibits sputtering from the leads, preform and bond wires.

8 Claims, 4 Drawing Sheets

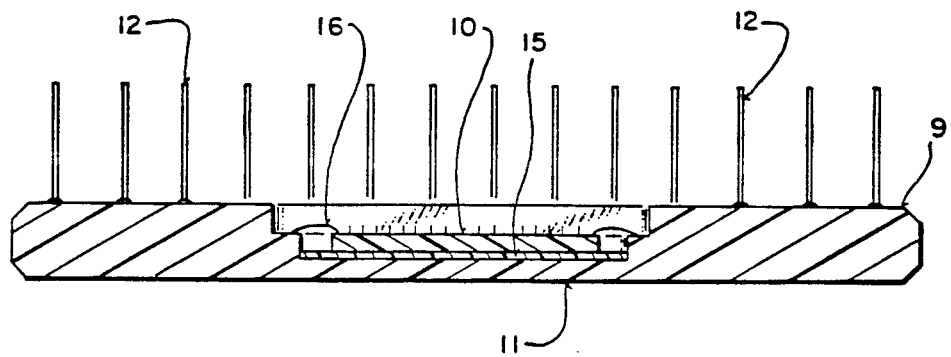
FIG_1
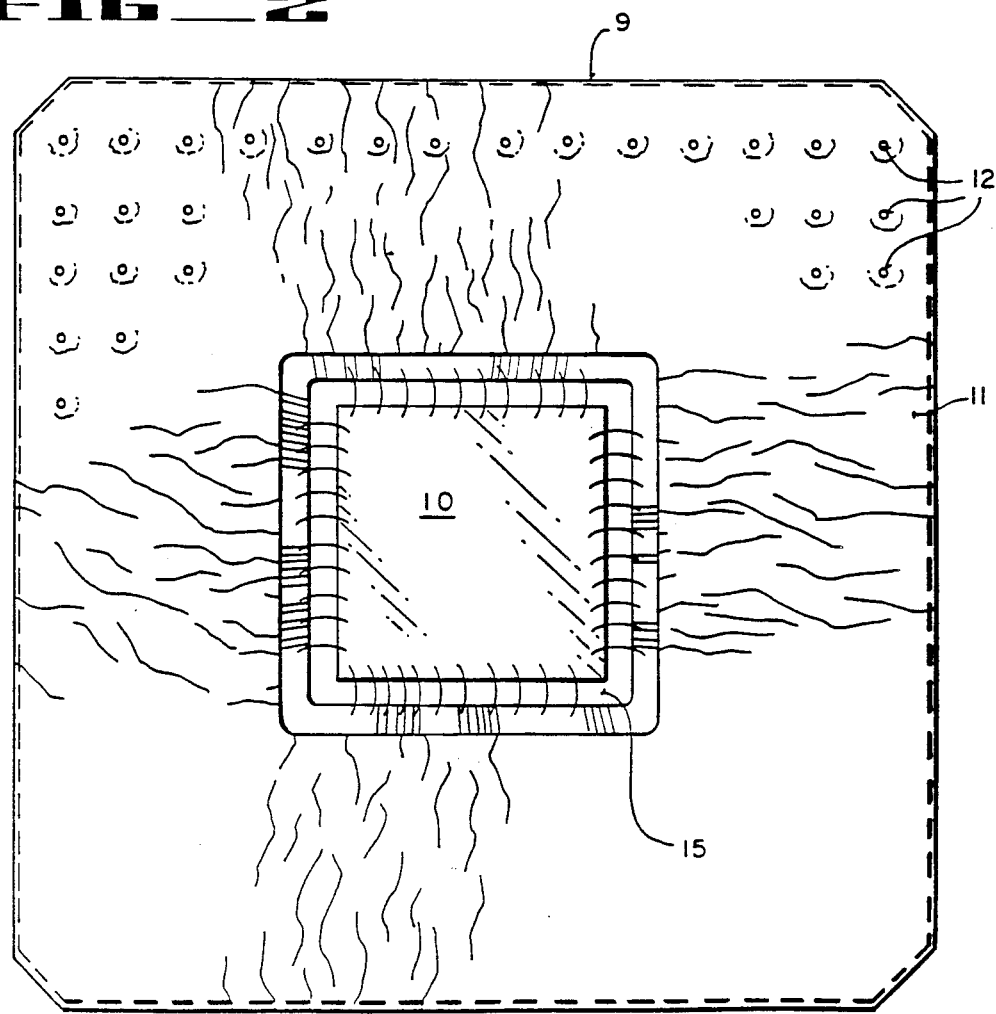
FIG_2

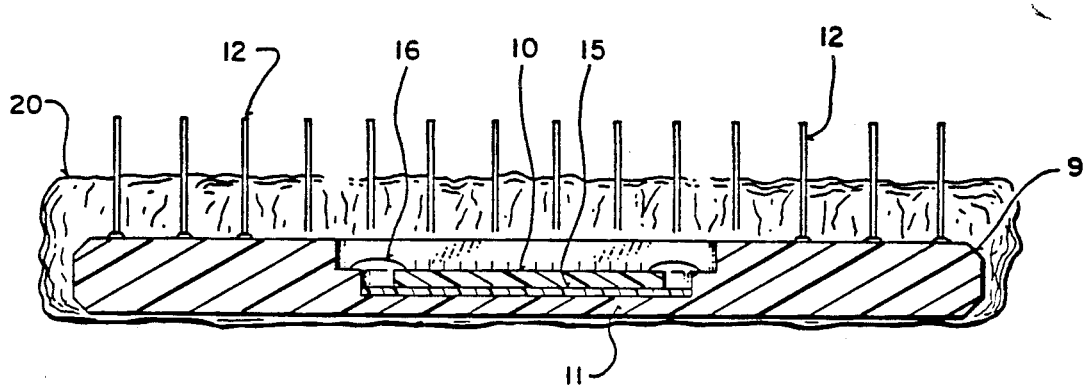
FIG_3
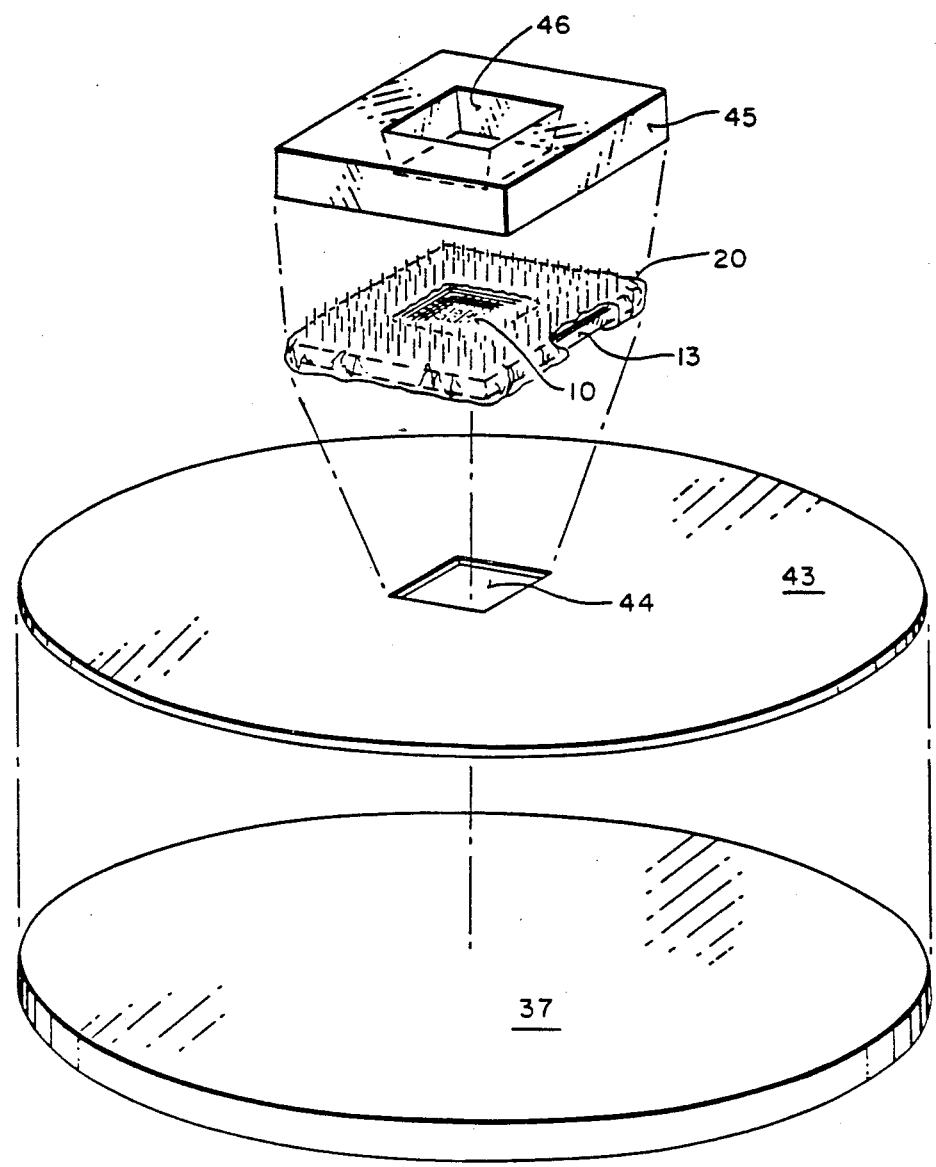
FIG_5

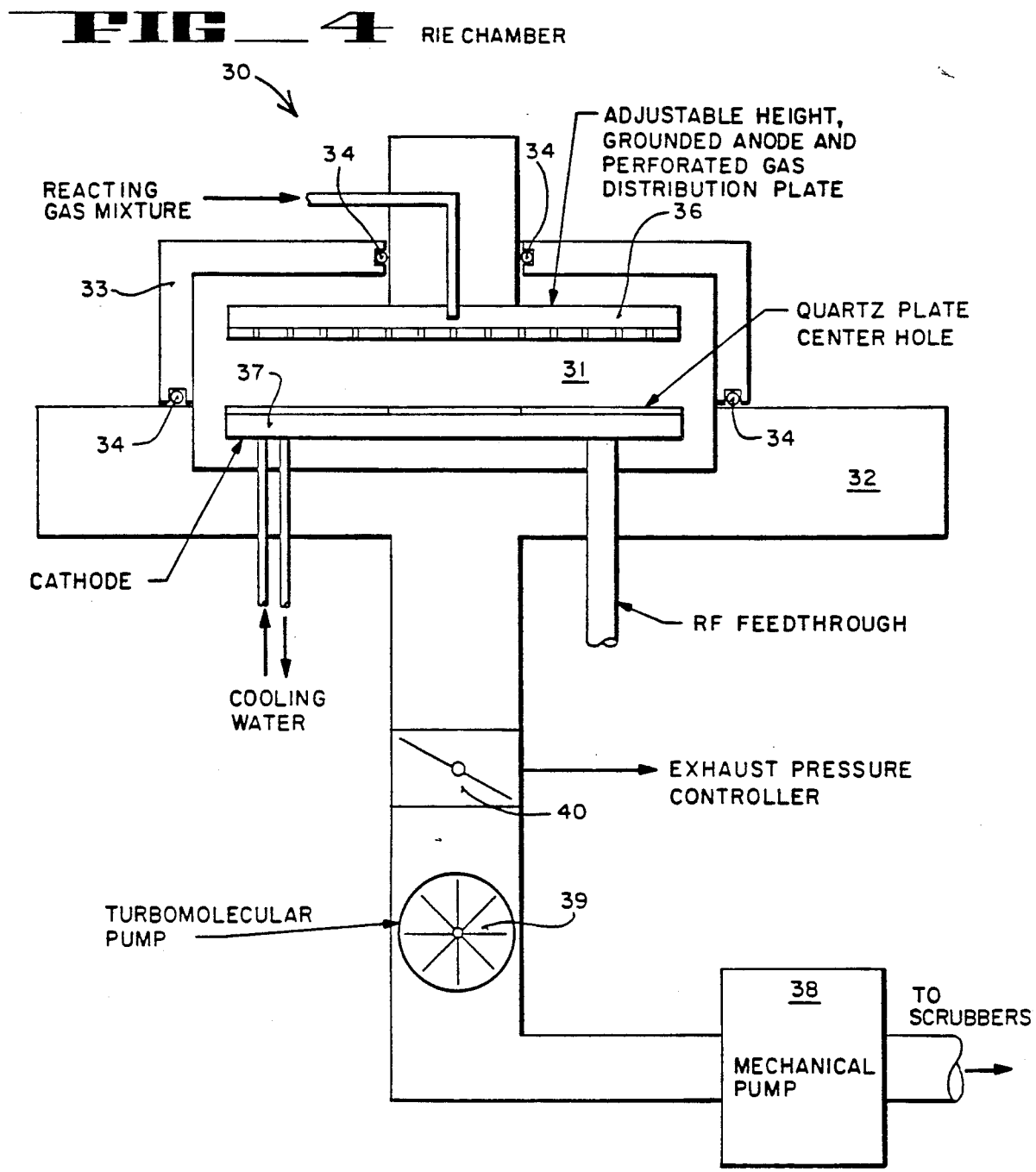

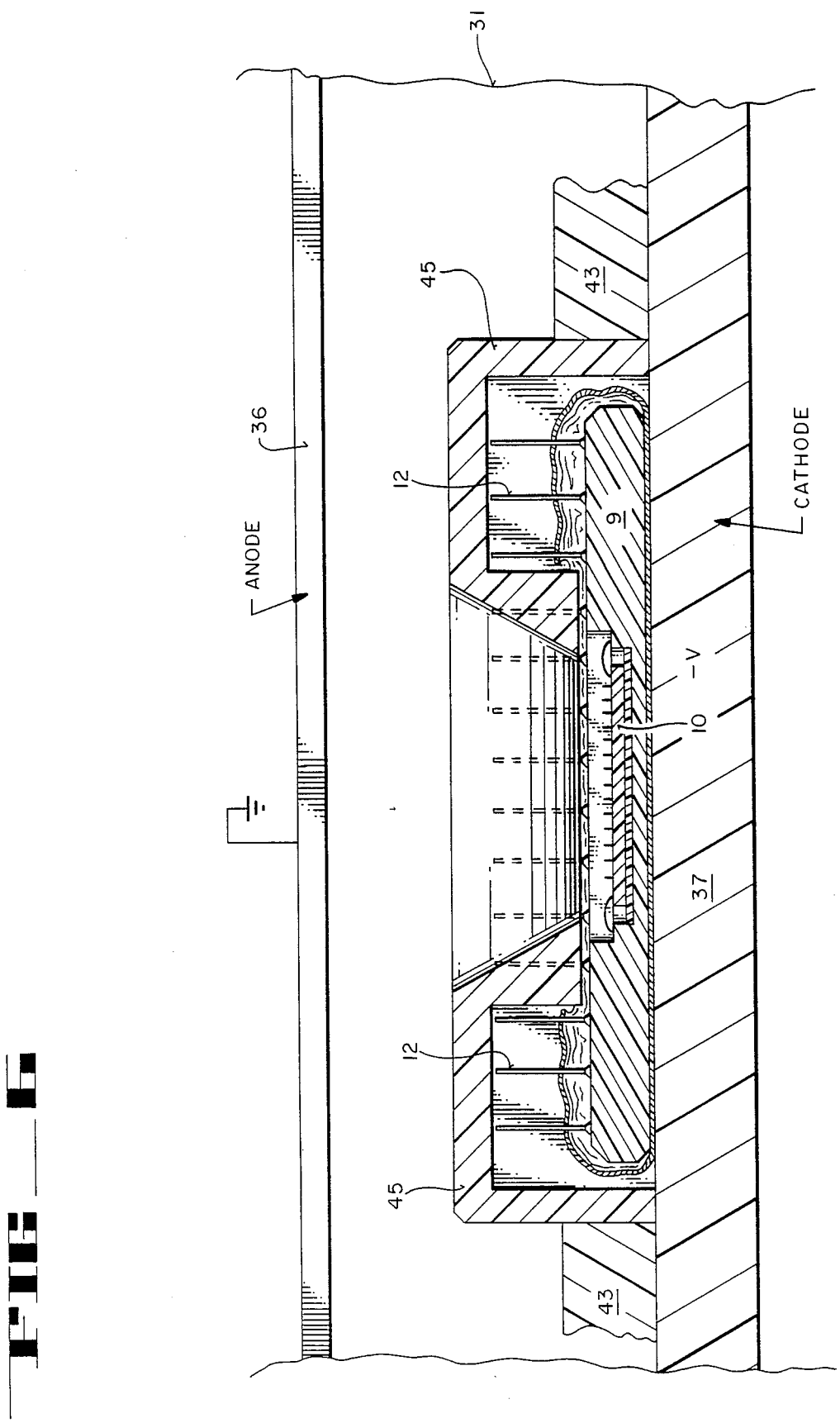
FIG_5

ETCH-BACK PROCESS FOR FAILURE ANALYSIS OF INTEGRATED CIRCUITS

BACKGROUND OF THE INVENTION

This is a divisional of application Ser. No. 243,787 filed Sep. 13, 1988.

1. Field of the Invention

The present invention relates to the field of failure analysis of integrated circuits.

2. Prior Art

In order to evaluate failed semiconductor integrated circuits, various well known failure analysis techniques require the removal of passivation layers in order to expose the underlying circuit layers. The passivation layer or layers are removed so that probing of the integrated circuit can be achieved. Analysis of failed semiconductor devices is essential in order to determine the cause of such failure.

Once failure has been detected, the integrated circuit which is typically embodied in a die is exposed. Normally, this entails removing a portion of the outer packaging material to expose the die, although the die can be completely removed from the package. In certain instances, where a lid is placed over the die during formation of the package, only the lid need be removed to expose the die.

After exposing the die, etching methods are used to remove the protective passivation layers overlying the circuit layers. The circuit components are embedded in the lower layers of the substrate and are interconnected by interconnection layers, which are typically of metal. The passivation layer is usually comprised of glass, such as phosphosilicate glass. Although wet etching can be used, the wet etchant technique is not preferable for use with other passivation layers because wet etching techniques will destroy the metal bond pads before complete etching can be achieved. Therefore, where the passivation layer is comprised of oxide, nitride or oxynitride layers, plasma etching techniques utilizing fluorocarbons are typically used. Plasma etching will not deteriorate the metal layers as is the case with the wet etching technique.

However, problems are still encountered in the use of plasma etching to remove the passivation layers to expose the underlying metal layers. For example, without the use of selective etching techniques, isotropic etching will tend to etch layers underlying the metal layers. That is, because isotropic etching techniques etch away the material in all directions, and in many instances, insulating layers underlying metal areas are also etched away. Without the underlying support, the metal lines are simply lifted away.

In order to provide selective etching, anisotropic etching techniques are used to prevent the underlying layers from being etched away. Unfortunately, most anisotropic plasma etching techniques cause sputtering to occur. Sputtering is a phenomena well-known in the prior art and is simply stated as the emission of secondary material caused by the bombardment of particles used for plasma etching. For example, unwanted sputtering of metal particles onto the passivation layer occurs during anisotropic plasma etching, such sputtering of metal originating either from the metal areas of the chip, or from the metallic base upon which the die is located. The metallic base, typically a preform, is usually comprised of gold. Metal is sputtered onto portions of the passivation layer such that the sputtered metal landing on the passivation layer inhibits etching of the underlying passivation layer, the result being a non-uniform topography of the layer being etched. Additionally, the gas mixture used for plasma etching has a tendency to form polymers. The formation of the polymers on the etching surface can produce a Teflon TM— like compound which also inhibits the etching of the underlying surface.

It is appreciated that what is needed is an etching technique that removes protective passivation layers of the integrated circuit device to expose the various underlying metal areas, but that the removal of the passivation layers be achieved in a selective and uniform manner to expose the metal areas without destroying it. Although various prior art techniques are known to remove passivation layers using anisotropic etching, sputtering and polymerization present significant problems in removing the passivation layer.

SUMMARY OF THE INVENTION

The present invention describes an apparatus and a method to inhibit sputtering of undesirable material onto a passivation layer of an integrated circuit during reactive ion etching of the passivation layer. A delidded integrated circuit device has its integrated circuit exposed. All of the terminals of the integrated circuit are electrically coupled together. Typically, when the integrated circuit is still in its package, a metallic foil is pressed onto the leads until the leads puncture through the foil. This ensures electrically coupling of the terminals of the integrated circuit. The foil is wrapped about the package, not only to provide electrical coupling, but also to provide thermal coupling.

A plate made from an etch-resilient material is placed on a cathode electrode. The plate has an opening disposed throughout so that the integrated circuit, when placed in this opening, makes contact with the cathode. Then an etch-resilient cover is placed over the integrated circuit and the plate opening. An opening in the cover is disposed over that portion of the integrated circuit which is to be etched. The cover opening permits anisotropic etching of the exposed portion of the integrated circuit and covering other areas to inhibit sputtering of unwanted material onto the etching portion.

The etch-resilient materials can be selected from a variety of materials. However, the present invention uses quartz or polycarbonate. In an alternative embodiment vitreous graphite is used for the plate. Because vitreous graphite is electrically conductive, an opening is not needed to allow the integrated circuit to contact the cathode.

DESCRIPTION OF THE DRAWINGS

FIG. 1 is a cross-sectional view showing an integrated circuit device.

FIG. 2 is a top plan view of FIG. 1 and showing a pin-grid-array packaging of an integrated circuit die.

FIG. 3 is a cross-sectional view showing a metallic foil about the leads of the integrated circuit device of FIG. 1.

FIG. 4 shows one example of a reactive ion etcher used to etch dielectric layers in the practice of the present invention.

FIG. 5 is a pictorial representation showing the apparatus of the present invention.

FIG. 6 is a cross-sectional view showing the apparatus of the present invention as used in etching the dielectric layer of the integrated circuit of FIG. 1.

DETAILED DESCRIPTION OF THE INVENTION

The present invention describes an apparatus and a method to be used in conjunction with an etcher to remove dielectric, especially passivation, layers from an integrated circuit. In the following description, numerous specific details are set forth in order to provide a thorough understanding of the present invention. It will be obvious, however, to one skilled in the art that the present invention may be practiced without these specific details. In other instances, well-known processes have not been described in detail so as not to unnecessarily obscure the present invention.

Referring to FIGS. 1 and 2, an integrated circuit package 9 is shown. Package 9 is utilized to house an integrated circuit which is usually in a form of a die 10. Integrated circuit die 10 typically resides on a metal base, such as a metallic preform 15. Preform 15 is typically comprised of gold or a gold alloy, and in some instances may include a barrier metal. Coupling means, such as bonding wires 16, are used to couple bonding pads disposed on die 10 to interconnection lines for coupling to various leads 12 of package 9. Ceramic or plastic molding 11 is normally used to encase all but the portion of lead 12 used for external connection, such as to printed circuit boards. The packaging of integrated circuit devices, such as die 10, is well-known in the prior art. It is to be appreciated that the particular embodiment shown in FIGS. 1 and 2 are for illustrative purposes only, and is not presented to limit the scope of the present invention. Further, the specific drawing of the package 9 of FIGS. 1 and 2 show a square pin grid array (PGA) package. However, the size, shape and lead arrangement of a package is not critical to the practice of the present invention.

When a given integrated circuit "chip" fails, tests need to be performed on the device to determine the cause of its failure. If external tests, such as signal measurements at the various leads, or analysis of programmed outputs, can not determine the extent of the failure, then more elaborate diagnostic tools must be used to determine the cause of the failure. Further, if the diagnostic method is to locate a faulty component(s) within the integrated circuit, then measuring the various signals at the pins 12 will usually not provide the desired answer. To perform such elaborate tests, the integrated circuit need to be evaluated internally. One such technique for internal evaluation of integrated circuits is the use of Electron Beam (E-beam) to measure the voltage at various circuit locations of the integrated circuit. Such an E-beam diagnostic technique is described generally in "Fundamentals of Electron Beam Testing of Integrated Circuits"; E. Menzel and E. Kubalek; Scanning, Vol. 5, pp. 103-122; 1983. However, in order to perform such E-beam diagnostics, the integrated circuit will need to have its metal layers exposed to the E-beam scan. To perform such a scan, the integrated circuit must not only be exposed, but passivation layers overlying the metal layers of the integrated circuit must be removed to expose the underlying metal lines. Such removal of overlying passivation layers to expose the underlying metal layers is well-known in the prior art, as was described in the background section above. However, as was also stated in the background section above, the use of an anisotropic etching techniques presents additional problems of sputtering and polymerization.

As exemplified in FIGS. 1 and 2, when a semiconductor device is to be analyzed for failure analysis, a portion of the package 9 overlying die 10 is removed to expose die 10. Typically a package, such as package 9, will have a cover overlying die 10, which cover can be removed to expose die 10. Further, such covers can be used to hermetically seal die 10 within package 9. If a molding is used to provide a cover over die 10, such molding is not readily removeable and other means, such as grinding away of the portion of molding 11 overlying die 10 must be achieved. When die 10 is exposed, as shown in the top view of FIG. 2, more than likely, preform 15 and bonding wires 16 are also exposed.

If prior art techniques are utilized at this point to etch away a passivation layer of die 10, then the complete package 9 is placed in an etching chamber to etch away the passivation layer. If placed in a plasma etching machine, polymers can readily form onto the surface of the passivation layer which forms all or most of the exposed surface of die 10. Further because of the metallic presence of preform 15, wires 16 and even metal leads 12, these exposed metal areas will sputter metal particles upon the surface of the passivation layer of die 10. Such sputtering inhibits further etching away of the passivation layers underlying the sputtered areas.

In order to prevent or at least greatly inhibit such undesirable effects caused by the prior art technique, the present invention is used. Referring to FIG. 3, the semiconductor device 9 of FIGS. 1 and 2 has been worked to expose delid die 10 for performing failure analysis. Next, a metallic foil 20, having a sufficient surface area, is placed over all of the exposed pins 12 of the package 9. The metal foil 20 is then pressed toward the surface of package 9 such that pins 12 puncture the metallic foil 20, wherein foil 20 can be slid toward the molded surface 11 of package 9. The edges of metallic foil 20 is then wrapped around to encompass the package 9. Either previous to or after the placement of metallic foil 20 around package 9, a portion of metallic foil 20 is cut to expose die 10. Therefore, at the conclusion of the placement of metallic foil 20 around package 9, the package is wrapped in metallic foil 20, but leaving die 10 exposed. It is essential that all of the leads 12 contact metallic foil 20 so to make a common electrical connection of all leads 12 to foil 20. It is to be appreciated that metallic foil 20 is used in the preferred embodiment, however, various metallic coverings can be used, not only to cover the unexposed portions of package 9, but also to couple the leads 12 together. Further, portions of package 9 can be left uncovered, as long as the leads are coupled together electrically, because the lead portion of the package will be covered as later described.

Then, the metal foil 20 covered integrated circuit package 9 of FIG. 3 is placed in a chamber of a plasma etching equipment. Although various plasma etching methods can be used, the preferred embodiment uses a special method of plasma etching called reactive ion etching (RIE). RIE offers etch and anisotropy for providing vertical etching profiles without undercutting. This provision of etch directionality, as well as selectivity, prevents over etching and undercutting which could result in severe topology or lifting of metal lines. RIE enables both of these parameters, anisotropy and selectivity, to be optimized by selecting the combination of gas, composition and pressure. Further, fluorocarbons are used to etch the passivation layer in the preferred embodiment, primarily because fluorocarbons do not etch metal.

Referring to FIG. 4, one example of an RIE apparatus 30 used in the preferred embodiment is shown. RIE device 30 is comprised of equipment base 32 which forms a boundary for a containment area for apparatus 30. A lid 33 is placed onto base 32 to form a vacuum tight chamber 31. Seals 34 ensure that a vacuum is contained in chamber 31. An upper electrode 36 which forms the anode is attached to the upper portion of chamber lid 33. Reacting gas mixture is then pumped through to anode 36 and perforations 35 along anode 36 permits the distribution of gas into the RIE chamber 31. A cathode 37 resides at the lower portion of chamber 31 and forms the other electrode within chamber 31. Mechanical pump 38 and turbo-molecular pump 39 are arranged in serial fashion with an exhaust pressure controller 40 to pump air out of chamber 31 for providing the necessary vacuum. An RF feed through is provided to cathode 37, for electrical coupling as well as cooling water to maintain cathode 37 at a regulated temperature.

Although a particular RIE apparatus 30 is described above, it is to be appreciated that the preferred embodiment is being provided for illustrative purpose only, and that a variety of prior art plasma etching equipment can be used to practice the present invention. Further, the RIE apparatus 30 of the preferred embodiment grounds anode 36 and the cathode 37 is driven by a high frequency RF oscillator which causes cathode 37 to build up to a potential of approximately −600 V. The −600 V is a DC bias voltage which builds on cathode 37 during operation. However, the precise magnitude of this cathode voltage will depend on gas pressure, etching power and the loading on the reactor. The cathode 37 of the preferred embodiment is manufactured from stainless steel, but a variety of other materials used as electrodes in prior art plasma etching chambers can be used as well. It is to be appreciated that this particular RIE apparatus is provided for illustrative purpose only and that other etcher equipment can be readily used.

Referring to FIGS. 5 and 6, the delidded and foiled integrated circuit package 9 of FIG. 3 is placed onto cathode 37. The metallic foil 20 permits electrical coupling of all leads 12 to cathode 37. The electrical contact is essential to maintain all leads 12 at approximately the same voltage as cathode 37, so that a significant difference in potential does not occur between cathode 37 and the various leads 12 which connect to circuits on die 10. By maintaining all leads at approximately the same potential as cathode 37, the circuits within die 10 are protected from any further destruction due to potential difference between cathode 37 and leads 12. This ensures that the entire chip including the preform and substrate are floating at the potential of the driven electrode. Further, the foil 20 also provides thermal coupling to transfer heat to the water cooled cathode 37.

Then, a plate 43 having an opening 44 is placed onto stainless steel cathode 37. Opening 44 is of appropriate shape and size to adequately contain the foil-wrapped package 9. Plate 43 rests atop cathode 37 and package 9 also maintains contact with cathode 37 by residing within opening 44. Plate 43 is to be manufactured from materials which do not sputter readily nor etch readily.

The plate of the preferred embodiment is fabricated from quartz or polycarbonate material. Quartz is preferred, since the presence of a large area of polycarbonate will significantly reduce the etch rate thereby causing very long etch times to etch the passivation layer. Glass materials such as microscope slides, can also be used. The purpose of the opening is to ensure electrical and thermo-coupling of foil to cathode 37.

Next a cap 45 is disposed onto cathode 37 to provide a cover for package 9. Cap 45 is of sufficient size and shape to encompass package 9 and to fit within opening 44. Opening 44 is to be of sufficient size and shape to permit both foil-wrapped package 9 and cap 45 to reside within the opening 44 yet not too large to expose large portions of stainless steel cathode 37. Cap 45 has an opening 46 which is to overly and expose die 10. The geometries of cap 45 are not essential to the practice of the present invention, except that cap 45 must enclose package 9 and reside within opening 44. Also, opening 46 must overlay the die 10, keeping the die 10 exposed. The actual etching takes place through opening 46 and the actual dimensions of opening 46 must be close to the dimensions of the die to prevent gold in the preform and bond wires from being exposed to the plasma. However, opening 46 must also be large enough to accommodate rotated and misaligned die 10 in the cavity. For example, an oversize of 50 mils for opening 46 has been found to be a good compromise for a die size of 400 mils.

Cap 45 is manufactured from materials similar to that used in the construction of plate 43. As stated earlier, quartz is preferred over polycarbonate for the significant difference in the etch rate. However, quartz is considerably more expensive than polycarbonate. Therefore, for economic reasons, the preferred embodiment uses quartz for plate 43 and polycarbonate material for cap 45. A single quartz plate is used, such that it has a sufficient opening 44 to admit the largest possible package which is to be diagnosed for failure analysis. Then, a plurality of caps 45 are built so that each individual cap 45 is used with its corresponding package and die configuration. The actual widths and lengths of the plurality of caps 45 will be designed to fit flush within opening 44. Opening 46 will differ from cap to cap, depending on the package/die configuration to be etched. For economical reasons, each cap 45 is manufactured from polycarbonate, such as Lexan TM, so that the cost of manufacturing these caps 45 is not excessively prohibitive. Further, due to the smaller area of cap 45, in relation to plate 43, the polycarbonate material of cap 45 will not place a significant load on the etcher. It is to be appreciated that other etch-resilient and sputter resilient materials can be used for plate 37 and cap 45 without departing from the spirit and scope of the invention.

Another reason for having opening 46 at cap 45 slightly larger than the die size is that a thin boundary layer appears to form close to the edge of the opening 46 of polycarbonate cap 45. This boundary layer tends to decrease the etch rate slightly about the edge. If the opening was exactly the size of die 10, then the thin boundary layer will cause the passivation layer around the edge of the die to etch at a slower rate causing non-uniformity in the etching of the passivation layer. The cap 45 functions to cover the leads 12 as well as portions of preform 15 and bonding wires to prevent excessive sputtering during the etching process. Further, polymerization caused by the presence of carbon and fluorine in the atmosphere is reduced because of the low pressures which can be used in RIE.

Once the various components are placed in the etcher atop cathode 37, the etching sequence is started. Plasma RIE techniques, which are well-known in the prior art, are used to etch the passivation layer of exposed die 10. Electrons in the plasma within chamber 31 are repelled from the cathode 37 and strike the grounded anode 36 releasing positive ions which bombard the lower electrode 37, which gives rise to the increased etch rate in the vertical direction. The vertical etch rate then becomes much greater than the lateral spontaneous reactive etch rate, resulting in high anisotropy. During the complete etching cycle, the etching sequence is monitored and when the appropriate metal lines have been exposed the etching sequence is terminated. The cap 45 inhibits sputtering from metal areas, such as leads, preform and bond wires.

In an alternative embodiment, vitreous graphite is utilized for plate 43. Vitreous graphite is also not prone to etching and sputtering. Because vitreous graphite is a conductor, opening 44 is not needed and the foiled package 9 can be placed directly onto the vitreous graphite plate. Electrical conductivity to cathode 37 is achieved due to the conductive nature of vitreous graphite. In this instance, the shape and size of opening 44 is not of concern (because of the lack of such opening 44) and alleviates the added problem of obtaining a tight fit with cap 45.

It is to be appreciated that the preferred embodiment, as well as the alternative embodiment described are provided not to limit the present invention but rather to exemplify two approaches to the practice of the present invention. Further, although a particular package 9, pin grid array (PGA), is shown in the Figures, the package shape, size or type is inconsequential to the practice of the present invention. Also, although only one passivation layer is mentioned in the description above, it is to be understood that multiple layers, including other passivation layers, as well as dielectric layers, can be etched.

Thus, an etch back process for failure analysis is described.

We claim:

1. A method for etching exposed dielectric layer portions of an integrated circuit device housed in an integrated circuit package having a plurality of terminals to expose an underlying metal layer, such that said device is placed in a reactive ion etcher having an anode electrode and a cathode electrode comprising the steps:
    removing the top of said package so as to expose said device;
    coupling together said plurality of terminals of said device using electrically conductive means;
    placing an etch-resistant plate on the surface of said cathode;
    placing said device onto said plate wherein said device is positioned such that said plurality of terminals are electrically coupled to said cathode electrode;
    placing a cover having a center opening over said package to cover portions of said package which are not to be etched and exposing said dielectric layer portions of said integrated circuit device which are to be etched;
    etching said exposed portions of said device in said reactive ion etcher, wherein said cover prohibits sputtering of undesirable material onto said device.

2. The method of claim 1 wherein said plate has an opening throughout and said integrated circuit device is placed in said opening to electrically contact said cathode electrode.

3. The method of claim 1 wherein said etching step comprises anisotropically etching said exposed dielectric layer portions.

4. The method of claim 3 wherein the step of coupling said plurality of terminals of said device further includes the step of wrapping said package in a metallic foil such that said device having said dielectric layer to be etched is exposed and said plurality of terminals are coupled together.

5. The method of claim 4 wherein said step of placing said etch-resistant plate includes the step of placing said etch-resistant plate comprised of either quartz or polycarbonate and having a center opening sized to accomodate said package such that said device is positioned in said opening and said plurality of terminals are electrically coupled to said cathode electrode.

6. The method of claim 4 wherein said etch-resistant plate comprises conductive vitreous graphite and said step of placing said etch-resistant plate includes the step of placing said etch-resistant plate such that said plurality of terminals of said device are electrically coupled to said cathode.

7. A method for plasma etching exposed dielectric layer portions to expose an underlying metal layer in a failed integrated circuit device housed in an integrated circuit package having a plurality of terminals, in a reactive ion etches having an anode and a cathode comprising the steps:
    removing the top of said package so as to expose said device;
    wrapping said package in a metallic foil such that said device is exposed and said plurality of terminals are electrically coupled together;
    disposing an opening sized to accomodate said package in the center of of an etch-resistant plate;
    positioning said etch-resistant plate on the surface of said cathode;
    placing said device into said opening of said plate wherein said device with said plurality of terminals electrically coupled together is electrically coupled to said cathode;
    placing a cover having a center opening correspondingly sized to said device over said device wherein portions of said package which are not to be etched are covered and said dielectric layer portions of said device which are to be etched are exposed.
    etching said exposed dielectric layer portions of said device in said reactive ion etcher, wherein said cover prohibits sputtering of undesirable material onto said device.

8. The method of claim 7 wherein said etching step comprises anistropically etching said exposed dielectric layer portions.

* * * * *

UNITED STATES PATENT AND TRADEMARK OFFICE,
CERTIFICATE OF CORRECTION

PATENT NO. : 4,980,019
DATED : 12/25/90
INVENTOR(S) : William Baerg, Valluri R.M. Rao It is certified that error appears in the above-identified patent and that said Letters Patent is hereby corrected as shown below:

Col 6, Line 8    Insert --20-- after the word "foil"

Signed and Sealed this

Thirty-first Day of August, 1993

Attest:

BRUCE LEHMAN

Attesting Officer    Commissioner of Patents and Trademarks